United States Patent [19]
Nakano et al.

[11] Patent Number: 5,507,603
[45] Date of Patent: Apr. 16, 1996

[54] METHOD FOR DRILLING THRU-HOLES ON A LAMINATION SUBSTRATE AND A SHEET USED THEREIN

[75] Inventors: Takuji Nakano, Kusatsu; Takeshi Fujita, Uji; Katsuaki Matsuo, Kyoto; Chuzo Isoda, Uji, all of Japan

[73] Assignee: Dai-Ichi Kogyo Seiyaku Co., Ltd., Kyoto, Japan

[21] Appl. No.: 285,628

[22] Filed: Aug. 4, 1994

[30] Foreign Application Priority Data

Aug. 5, 1993 [JP] Japan ................ 5-194725

[51] Int. Cl.⁶ .......... B23B 35/00; B23B 15/08; B23B 27/06
[52] U.S. Cl. ............. 408/1 R; 428/458; 428/463
[58] Field of Search ........... 408/1 R; 428/458, 428/463

[56] References Cited

U.S. PATENT DOCUMENTS

| | | | |
|---|---|---|---|
| 4,781,495 | 11/1988 | Hatch et al. | 408/1 R |
| 4,929,370 | 5/1990 | Hatch et al. | 252/12.2 |
| 4,954,200 | 9/1990 | Trewiler | 408/1 R |
| 5,082,402 | 1/1992 | Gaku et al. | 408/1 R |

FOREIGN PATENT DOCUMENTS

| | | |
|---|---|---|
| 4-92493 | 3/1992 | Japan . |
| 4-92488 | 3/1992 | Japan . |
| 4-92489 | 3/1992 | Japan . |
| 4-92490 | 3/1992 | Japan . |
| 4-92491 | 3/1992 | Japan . |
| 4-92492 | 3/1992 | Japan . |
| 2252522 | 8/1992 | United Kingdom .......... 408/1 R |

*Primary Examiner*—Steven C. Bishop
*Attorney, Agent, or Firm*—Armstrong, Westerman, Hattori, McLeland & Naughton

[57] ABSTRACT

First of all, a high molecular sheet comprising a composite whose principal component is a special water soluble high molecular compound, or a multilayer sheet wherein a water soluble high molecular layer is piled on sheet material is prepared. Then, said sheet is layered on the entry side of a lamination substrate comprising insulating material and metallic foil. In this state, thru-holes are formed in the lamination substrate through said sheet. When forming thru-holes, said water soluble high molecular compound serves as a lubricant so as to extend drill life. In addition, it is possible to drill a lot of substrates, which are layered, at one time, resulting in the improvement of production efficiency.

23 Claims, 1 Drawing Sheet

METHOD FOR DRILLING THRU-HOLES ON A LAMINATION SUBSTRATE AND A SHEET USED THEREIN

FIELD OF THE INVENTION

The present invention relates to a method for drilling thru-holes in a lamination substrate such as a multilayer printed circuit board panel, and a sheet used therein.

BACKGROUND OF THE INVENTION

When forming thru-holes in an electronic lamination substrate such as a multilayer printed circuit board panel, metallic foil is usually placed on the above circuit board panel (sometimes referred to as the panel hereinafter) and then thru-holes are formed with a gimlet, a drill, a puncher or the like. There are problems that resultant debris sticks to the panel surface, the thru-hole walls or the edges surrounding the thru-hole during the method of forming the thru-hoes. Furthermore, there is another problem that the thru-hole wall formed with a rough surface. Therefore, such debris must be forcefully removed by installing a suction device additionally, or debris stuck to a neighboring portion of the formed thru-holes must be removed by grinding cut surface in conventional methods. However, it is not preferable to add these processes like sucking debris or grinding, which make the working process complicated.

To simplify such a process, there are methods that a sheet impregnated with a water soluble lubricant is placed on one side or both sides of the above lamination substrate, in which metallic foil is layered on an insulating material, and then thru-holes are drilled through this sheet by a drill or the like, in the lamination substrate U.S. Pat. No. 4,781,495 and U.S. Pat. No. 4,929,370). That is, the mixture, solid water soluble lubricant, comprising glycols such as diethylene glycol or dipropylene glycol, ester synthetic wax such as fatty acid, and a non-ionic surfactant is impregnated into a sheet such as paper, which is employed for drilling in the above method. Further, besides this method, there are methods of drilling thru-holes in a lamination substrate through a sheet wherein a high molecular layer is formed with water soluble high molecular polyethylene glycol or polypropylene glycol solely, or water soluble high molecular mixture thereof, or fatty acid ester thereof, or the like (Tokkaihei 4-92488, Tokkaihei 4-92489, Tokkaihei 4-92490, Tokkaihei 4-92491, Tokkaihei 4-92492, Tokkaihei 4-92493, and Tokkaihei 4-92494).

However, the above methods have various defects. For example, when forming thru-holes, the heat removal effect on a drill bit is not sufficient, stickiness occurs, lubricating effect cannot be obtained because the water soluble high molecular compound is too hard to melt, or the water soluble high molecular compound cannot be easily formed into a sheet due to inferior film formability which stems from poor thermoplasticity.

Furthermore, when using a metallic foil on which the water soluble compound layer is formed or a wear plate of metallic foil wherein the water soluble compound layer is directly formed therein to form thru-holes by a drill or a gimlet, the above water soluble compound may sometimes stick to the drill or the gimlet. For example, when forming thru-holes with a drill or a gimlet at a high speed rotation such as 50,000 to 100,000 rpm, since debris of the above water soluble compound sticks to the blade of the drill or the gimlet, the rotation balance may be disturbed. Therefore, the bit of the drill or the gimlet passes through the lamination substrate slantwise, not vertically. If a few lamination substrates are layered in such a forming process, the tip of the drill or gimlet passes through it slantwise, resulting in accuracy deterioration because the discrepancy is caused between the hole positions of the entry sheet and the exit sheet. For example, if the discrepancy between the entry sheet and the exit sheet reach 200 μm, layer processing becomes impossible.

Especially, the diameter of thru-holes has recently become smaller such as 0.5 mm, 0.3 mm, 0.25 mm and 0.20 mm due to the rise of packing density. For this reason, it is required to effectively control frictional heat caused in cutting with the drill and also heighten accuracy of the positioning of the thru-holes.

OBJECT OF THE INVENTION

The object of this invention is accordingly to provide a method of drilling thru-holes on the lamination substrate, superior in heat removal effect, lubricating effect and preventive effect of smear in forming thru-holes, resulting in an easy process of forming thru-holes with a high accuracy, and a sheet for a drilling process employed therein.

SUMMARY OF THE INVENTION

To accomplish the above object, a first embodiment of the invention is directed to a method of drilling thru-holes in lamination substrate made of insulating material and metal foil through a sheet for drilling, comprising (Y) or (Z) as below, by putting the sheet on the entry surface of the lamination substrate and forming thru-holes on the lamination substrate through the sheet with keeping the above condition, where (Y) is a high molecular sheet comprising water soluble high molecular compound wherein one component at least selected from the group of component (a) and component (b) below is a principal component.

(Z) is a multilayer sheet made by piling up water soluble high molecular layers on sheet material wherein one component at least selected from the group of component (a) and component (b) as below is a principal component;

(a) is a water soluble high molecular compound represented as the following (i);

(i) is a water soluble high molecular compound comprising an organic compound residue having two active hydrogen groups;

wherein the above is contained at not less than 70% by weight; and (b) is a water soluble high molecular compound comprising a repetitive unit represented as the following general formula (1).

(1)

In the above formula (1), A is a unit composed of a repetition of $$+CH_2CH_2O+ \quad \text{and} \quad +CH_2\underset{|}{\overset{R_1}{C}}HO+.$$

(Provided that the above $$+CH_2CH_2O+$$

exists at not less than 70% by weight in A, a repetitive number of $$+CH_2CH_2O+$$

is a positive number, and a repetitive number of $$+CH_2\underset{|}{\overset{R_1}{C}}HO+$$

is zero or a positive number. Furthermore, $R_1$ is a hydro carbon group.) X is an organic compound residue with two active hydrogen groups, and $R_2$ is a polycarboxylate compound residue or a diisocyanate compound residue.]

The second embodiment is directed to a single-layer sheet for drilling thru-holes composed of a water soluble high molecular compound whose principal component is at least one selected form the group consisting of component (a) and component (b) as the above. A third embodiment of the invention is directed to a multilayer sheet for drilling thru-holes comprising layering water soluble high molecular layers whose principal component is at least one selected from the group consisting of component (a) and component (b).

Namely, inventors of the present invention have conducted a series of researches on a method of forming fine thru-holes having a clean cut wall, which prevents heat generation, is superior in lubricating effect, and also prevents debris form spreading. As a result, they come up with an idea of employing a sheet (sheet Y) comprising a water soluble high molecular single-layer sheet wherein the principal component is a special water soluble high molecular compound superior in lubricating effect due to low melting point, or a sheet (sheet Z) wherein the above water soluble high molecular sheet is layered on sheet material. When forming thru-holes through this sheet layered on the substrate, a water soluble high molecular layer is easily melted with frictional heat caused by rotation of a drill and the like, so as to incorporate debris, resulting in the prevention of wall surface roughness and breaking or damage of a drill bit with the heat rise caused by frictional heat because the above melted water soluble high molecular compound works as a lubricant. That is, since the melting point of the above specific water soluble high molecular compound is low, the above water soluble high molecular compound melts immediately be heat generated in drilling thru-holes, whereby a heat removal effect and a lubricating effect are exhibited so as to prevent surface roughness. Furthermore, the process after forming the thru-holes can be simplified because grinding of the surface is unnecessary. Especially, the effect of the drilling method according to this invention is remarkable when forming very small thru-holes such as thru-holes not more than 0.5 mm in diameter. Generally, when the diameter of the thru-holes is small, the diameter of a drill bit or gimlet becomes small, which easily damages the bit with frictional heat occurred in forming the thru-holes in the lamination substrate. As a result, only one or two pieces of lamination substrate can be layered. However, according to this invention, it is possible to layer three or four pieces of the lamination substrate, which enables improved production efficiency.

Among all, in a three-layer structure, one embodiment of the above sheet Z, multilayer structure, it is avoidable for debris to stick to the blade of a drill or a gimlet because the above water soluble high molecular layer is sandwiched between an upper and lower sheet material. Namely, since the sheet material sandwiching the water soluble high molecular sheet prevents sticking, resulting in substantially no adhesion occurring. Therefore, if a drill and the like rotates at high speed, its bit does not break and contact an object to be drilled, resulting in a no discrepancy among hole positions of each substrate.

Furthermore, according to this invention, there is a characteristic of very low occurrence of haloing in copper after drilling because cut surface roughness is very low. When haloing occurs in an inner copper layer of a multilayer panel, copper rusts as time goes by on the portion where haloing occurs, or sometimes the copper circuit becomes disconnected. Therefore, it is required to control the occurrence of haloing as much as possible. The above haloing is caused because a galvanizing liquid which is permeated into the inner copper layer is difficult to remove in a rinsing process after galvanizing, resulting in copper rust due to this galvanizing liquid. In addition, there is a method of preventing oxidation of the galvanizing liquid with a reducing agent before galvanizing. In this case, the process become complicated because a reducing process is added. In the present invention, it is effective to prevent haloing without any addition process.

The present invention is now described in further detail.

The lamination substrate in this invention contains various print circuit panel substrates wherein metallic foil and insulating material are layered and laminated. For example, there is a metallic-foil layered lamination substrate, a multilayer lamination substrate having a printed circuit panel therein, a metallic-foil layered lamination substrate having a printed circuit panel therein, a metallic foil layered plastic film and the like.

As a substrate forming the above lamination substrate, for example, there is glass fabric impregnated with an epoxy resin (both sides coated with copper foil), glass fabric impregnated with an epoxy resin (single side coated with copper foil), glass fabric impregnated with a polyimide resin (both sides coated with a copper foil), glass fabric impregnated with polyimide (single side coated with copper foil), glass fabric impregnated with a fluororesin (both sides coated with copper foil), glass fabric impregnated with a heat curing polyphenylene oxide (PPO) resin (both sides coated with copper foil), glass nonwoven fabric cloth impregnated with an epoxy resin (both sides coated with copper), glass nonwoven fabric cloth impregnated with an epoxy resin (single side coated with copper) and the like. The substrate can be formed by layering one or more of the above base materials. Among all, a multilayer substrate can be obtained by etching a desired circuit on each substrate, and heat compressing each of them with employed prepreg to form the substrate.

A special sheet for drilling is employed in a method for drilling thru-holes in a lamination substrate of the present invention.

The above special sheets for drilling are roughly separated into two kinds of sheets. One is the single-layer structure of a water soluble high molecular sheet formed by a high molecular layer whose principal component is a special high molecular compound (sheet Y). Another one is the sheet of multilayer structure wherein a water soluble high molecular layer is layered on the base material (sheet Z).

First of all, sheet Y of the above single-layer is described.

The water soluble high molecular sheet of the above sheet Y is formed by a high molecular layer wherein a special water soluble high molecular compound is the principal component. In addition "~ is a principal component" contains the case of "~ is the only one component".

The above water soluble high molecular compound comprises at least one selected from the group consisting of the following component (a) and component (b).

(a) A water soluble high molecular compound represented as (i) as below.

(i) A water soluble high molecular compound comprising an organic compound residue having two active hydrogen groups, wherein the above is contained at not less than 70% by weight.

(b) A water soluble high molecular compound comprising a repetitive unit represented as the following general formula (1).

$$+AXAR_2+ \quad (1)$$

[In the above formula (1), A is a unit composed of a repetition of

(Provided that the above exists at not less than 70% by weigh in A, a repetitive number of is a positive number, and a repetitive number of is zero or a positive number. Furthermore, $R_1$ is a hydro carbon group.) X is an organic compound residue with two active hydrogen groups, and $R_2$ is a polycarboxylate compound residue or a diisocyanate compound residue.]

As components of the above component (a), $R_1$ is favorably a methyl group, an ethyl group, or a phenyl group. Besides, the weight average molecular weight is preferably set up not less than 1,000, most preferably 6,000 to 1,000,000. That is, when the weight average molecular weight of (a) component is less than 1,000, the water soluble high molecular compound is liquefied at a normal temperature, which does not meet with the object of the present invention.

The above component (a) can be obtained by addition polymerizing alkylene oxide whose principal component is ethylene oxide, into an organic compound having two hydrogen groups.

As the above organic compound having two active hydrogen groups, there are alicyclic diols such as ethylene glycol, diethylene glycol, propylene glycol, dipropylene glycol, 1,4-butanediol, 1,6-hexanediol, neopentylglycol, bisphenol A, polytetramethylene glycol, cyclohexane-1,4-dimethanol, and amines such as buthylamine, octylamine, laurylamine, cyclohexylamine, and aniline. These are employed solely or in combination.

As the alkylene oxide mainly made of ethylene oxide, for use in the addition polymerization with the above organic compound, there are ethylene oxide solely, the mixture of ethylene oxide as a main component and propylene oxide, butylene oxide, styrene oxide, α-olefin epoxide, glycidyl ether or the like. In addition, the content of the above ethylene oxide is set up not less than 70% by weight (abbreviated as % hereinafter).

The above component (a) can be obtained by employing each ingredient of the above, and reacting them with caustic alkali such as sodium hydroxide or potassium hydroxide as a catalyzer at a temperature between about 90° and 200° C. for 2 to 30 hours so as to addition polymerize at block or random alkylene oxide containing ethylene oxide to the organic compound having two active hydrogen groups. Besides, there another method where the alkali metal catalyzer is dispersed into a hydrocarbon solvent and alkylene oxide is added to addition polymerize with an organic compound having two active hydrogen groups.

Now, component (b) is described. The above component (b) is a water soluble high molecular compound composed of a repetitive unit represented as the above formula (1). $R_1$ of the formula (1) is preferably a methyl group, an ethyl group or a phenyl group. Further, the weight average molecular weight is set up preferably not less than 10,000, more preferably 30,000 to 2000,000, most preferably 80,000 to 160,000. The water soluble high molecular compound composed of the repetitive unit represented as the above general formula (1) can be obtained by employing the following two components (A) and (B).

(A) Polyalkylene oxide compound prepared by addition polymerizing alkylene oxide, whose principal component is ethylene oxide, with an organic compound having two active hydrogen groups.

(B) At least one selected form the group of polycarboxylate compound and diisocyanate compound.

As the organic compound having two active hydrogen groups of the above (A), there are the same as mentioned in the above component (a).

As the alkylene oxide, whose principal component is ethylene oxide for addition copolymerization with the above organic compound there are the same as mentioned in the above component (a). The content of the above ethylene oxide is set up not less than 70% same as the above component (a).

The above component (A) can be obtained by employing each ingredient of the above, and reacting them with caustic alkali such as sodium hydroxide or potassium hydroxide as a catalyzer at a temperature between about 90° and 200° C. for 2 to 30 hours so as to addition polymerize at block or random alkylene oxide containing ethylene oxide to the organic compound having two active hydrogen groups. Besides, there is another method where the alkali metal catalyzer is dispersed into a hydrocarbon solvent and alkylene oxide is added to addition polymerize with an organic compound having two active hydrogen groups.

The weight average molecular weight of component (A), polyoxy alkylene polyol, obtained by employing each ingredient of the above is preferably not less than 1,000, most preferably from 5,000 to 30,000. That is, if the weight average molecular weight is less than 1,000, the mixing ratio of the above corresponding (B), the connecting agent of dicarboxylate compound or diisocyanate compound increases so that the tendency of deterioration of solubility in water can be seen. On the other hand, if the weight average molecular weight is between 5,000 and 30,000, the melting point of the water soluble high molecular compound obtained by reacting with the connecting agent of component (B) becomes moderately high, and also good film formability is realized.

As polycarboxylate compound of component (B), which reacts with the above component (A), there are polycarboxylic acids, polycarboxylate anhydrides, and lower alkyl ester of polycarboxylic acids. As the above polycarboxylic acids, there are dicarboxylic acids such as phthalic acid, isophthalic acid, terephthalic acid, malonic acid, succinic acid, sebacic acid, maleic acid, fumaric acid, adipic acid, itaconic acids and the like, and tetracarboxylic acid such as pyromellitic acid. As the above polycarboxylate anhydrides, there is each anhydride of the above various polycarboxylic acids. Finally, as the lower alkyl esters of the above polycarboxylic acids, there are methyl ester, dimethyl ester and the like of each polycarboxylic acid of the above. These are employed solely or in combination.

As the diisocyanate compound of the above component (B), specifically, there are tolylenediisocyanate, diphenylmethane diisocyanate, hexamethylene diisocyanate, isophorone diisocyanate, xylene diisocyanate, 4,4-methylene-bis (cyclohexyl isocyanate) and the like. These are employed solely or in combination.

The water soluble high molecular compound [component b] composed of a repetitive unit represented as general formula (1) can be obtained by reacting the above components (A) and (B) as follows. The first case that components (B) is polycarboxylate compound is described. That is, the above (A) is prepared, and the above components (B) is added therein. The mixture of components (A) and (B) is heated. Then, dehydration or dealcoholization is conducted under a heating condition at 80° to 250° C. and a reduced pressure into 0.1 to 2.7×10³ Pa, resulting in the water soluble high molecular compound. The time for such a reaction is usually 30 minutes to 10 hours.

The mixing ratio (A/B) of both components (A) and (B) to be reacted is preferably set within the scope of A/B=1/0.90 to 1/3.50 at equivalent ratio, more preferably A/B=1/0.95 to 1/3.50.

Next, another case that the above components (B) is a polyisocyanate compound is described. The reaction to be urethanated in diisocyanate compound is conducted, for example, by mixing polyalkylene oxide and diisocyanate compound within the scope of 0.5 to 1.5 at equivalent ratio of NCO/OH so as to be reacted at a temperature of 80° to 150° C. for 1 to 5 hours.

The weight average molecular weight of thus obtained water soluble high molecular compound (b) is preferably set at not less than 10,000, the more preferably 30,000 to 200,000, most preferably 80,000 to 160,000, as mentioned above. If the weight average molecular weight is less than 10,000, mechanical strength is low and there is a tendency that secondary workability is inferior. On the other hand, if the weight average molecular weight is over 200,000, the flowing characteristic in a melt condition is deteriorated and a melt fracture phenomenon is caused, resulting in impossibility of extrusion molding.

Besides, it is possible to appropriately mix polyethylene glycol, water soluble lubricant such as a non-ionic surfactant, water soluble anti-rust agent and the like into the above (a) and (b) components to improve lubrication according to the case.

The sheet Y employed for drilling in this invention can be manufactured, for example, by a following method. That is, the sheet Y can be manufactured in a normal method such as solution casting method, fusion intrusion with T-die or inflation, or calendering method by employing the above specific water soluble high molecular compound.

As the thickness of the above sheet Y, 50 to 500 μm is preferable.

Now, multilayer structure sheet (sheet Z) is described.

The multilayer structure sheet for forming the above sheet Z comprises sheet material and a water soluble high molecular layer whose principal component is at least one component selected from the group composed of the above (a) and (b) formed on the above sheet material surface. In addition, such expression "~ is a principal component" contains a case that "~ is the only one component".

As the above components (a) and (b), there are the same water soluble high molecular compound as employed in the above single-layer structure sheet Y.

The above sheet material is not critical, however, and metallic foil is preferable. Among all, there are foils of aluminum, zinc, iron and the like. The thickness of the sheet material is set between 50 to 500 μm.

As this sheet Z, multilayer structure, there are, for example, the following structures.

① A sheet wherein water soluble high molecular layer is formed on one side or both sides of the sheet material.

② A sheet of three-layer structure wherein the water soluble high molecular layer is sandwiched between two sheets of the sheet material.

The above ① is manufactured, for example, by the following method. That is, the water soluble high molecular film is manufactured by a solution casting method, fusion extrusion like T-die or inflation, or a calendering method with a forming material wherein the above specific water soluble high molecular compound is a principal component. Then, this water soluble high molecular film and sheet material are layered and laminated so that ① is manufactured. Or, the specific water soluble high molecular compound is dissolved into water or an organic solvent, and the mixture is thinly coated on the above sheet material surface, and finally the above organic solvent is solvent is completely removed at a temperature 40° to 50° C. so that ① is manufactured. In this case, the special high molecular layer can be formed by thinly coating the one side or both sides of the sheet material therewith.

Figure 1:
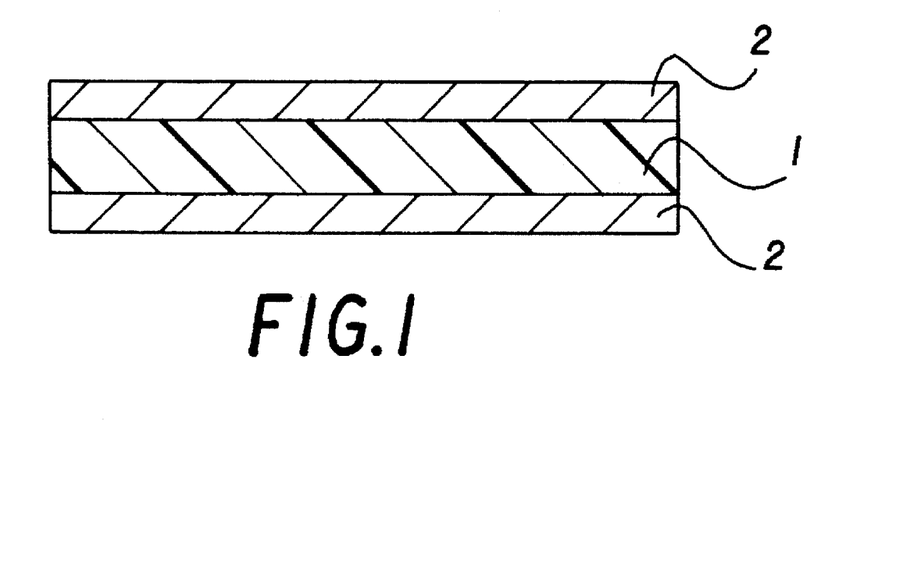
FIG. 1 is a cross-sectional view illustrating one example of a sheet for drilling in the present invention and FIG. 2 is a schematic view illustrating the method of drilling in the present invention.

The three-layer sheet of the above ② is manufactured, for example, by the following method. That is, the water soluble high molecular sheet is manufactured in the same manner as the above ①. Then, the three-layer structure sheet shown in FIG. 1 can be obtained by placing sheet material so as to sandwich the above water soluble high molecular sheet and adhering them so as to be laminated. In the figure, 1 is the water soluble high molecular layer and 2 is the metallic foil.

Alternatively, the above specific water soluble high molecular compound [component (a) and component (b)] is dissolved into water or organic solvent. This solution is thinly coated on the above metallic foil. Then the above organic solvent is completely removed at a temperature 40° to 50° C. to manufacture a two-layered product of the water soluble high molecular layer and the sheet material. Subsequently, the sheet material is adhered to the water soluble high molecular layer side of such a two-layered product to be laminated, so that the three-layer structure sheet can be obtained.

In addition, as the sheet material of two layers in the above three-layer structure ②, either the same material or different material may be used.

The thickness of the above sheet Z is preferably set within the range of 50 to 500 μm in both the above ① and ②. The thickness of the entire sheet of two-layer structure is preferably 100 to 1,000 μm, while that of three-layer structure is preferably 150 to 1,500 μm.

Drilling through a lamination substrate (i.e., a printed circuit board panel) in this invention is conducted for example, in the following method. First of all, a normal lamination substrate as an object to be drilled is prepared.

Figure 2:
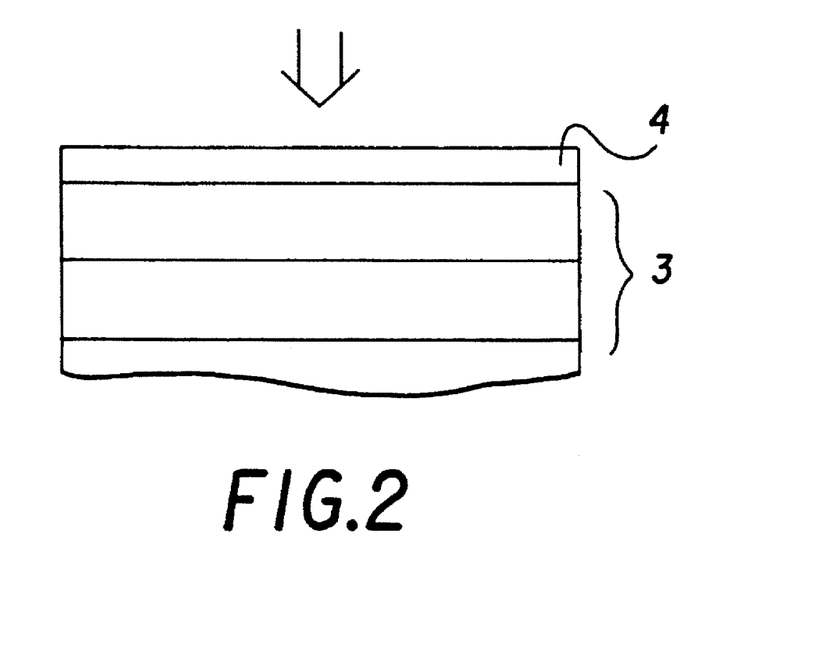

On the other hand, the above sheet 4 for drilling is prepared. As shown in FIG. 2, the sheet 4 is layered on the entry substrate, form which the drill or the gimlet starts to pass through (in the direction indicated by an arrow), of the above lamination substrate 3 so that thru-holes are formed in a desired diameter on a desired position of the lamination substrate 3 through the sheet 4. In this way, drilling is conducted.

The sheet 4 is preferably positioned on both sides of the lamination substrate 3, however, when the sheet is placed only on one side of the lamination substrate 4, it must be positioned on the entry side for the drilling. In addition, when the sheet 4 comprises a two-layer structure of the sheet material and a water soluble high molecular layer, the water soluble high molecular layer surface is preferably positioned so as to face the lamination substrate 3.

EFFECTS OF THE INVENTION

As aforementioned, when forming thru-holes in the lamination substrate, a single-layer sheet (sheet Y) mainly made of the special water soluble high molecular compound [component (a), component (b)], or a multilayer sheet (sheet Z), wherein special water soluble high molecular layer(s) is/are layered on the sheet material surface, is piled on the above lamination substrate, so that drilling is performed. For this reason, when drilling, the above water soluble high molecular layer(s) melt(s) and incorporate(s) debris so as to prevent not only cut surface roughness, but also the rise in temperature caused by frictional heat and also drill bit fracture, because the melted water soluble high molecular compound serves as a lubricant. In addition, it is not necessary to grind the cut surface after drilling, resulting in simplification of the process. Especially, the drilling in this invention is adaptable to a forming process of drilling small thru-holes such as those not more than 0.5 mm in diameter. Therefore, in drilling a substrate, usually only 1 or 2 pieces can be layered, however, according to this invention, 3 or 4 pieces can be layered for drilling, which can improve production efficiency.

Furthermore, since the above water soluble high molecular layer is sandwiched between the upper and lower substrates in one embodiment employing the multilayer structure sheet, sheet Z, in the present invention, the debris are not easily adhered to the blade of the drill or the gimlet. Namely, since adhesion is prevented by the sheet material sandwiching the water soluble high molecular layer, substantially no debris stuck to the blade. Therefore, even if a drill and the like rotates at a hgih speed, the drill tip will not break and contact the object for drilling thru-holes. As a result, when drilling thru-holes on multilayer substrates, there causes no discrepancies among all substrates, which enables forming thru-holes at a high accuracy in positioning because the drill bit can contact the object to be drilled without the drill bit at fracture at the high speed rotation.

Furthermore, according to the drilling method of the present invention, since the degree of the cut surface roughness is low, occurrence of haloing can be greatly restrained in copper after drilling. When holoing occurs in a inner copper layer in multilayer substrates, copper rusts as time goes, and sometimes the copper circuit is disconnected. Therefore, it is required to prevent haloing. The above hoaloing is caused because galvanizing liquid permeated into the copper inner layer is difficult to remove in a rinsing process after galvanizing, resulting in copper rust due to this galvanizing liquid. In addition, there is a method of preventing oxidation of galvanizing liquid with reducing agent before galvanizing. However, in this case, a process become complicated because reducing process is incorporated therein additionally. In the present invention, it is effective to prevent haloing without any additional process.

The following examples and comparative examples are further illustrative of the present invention.

(i) First of all, the sheet Y, single-layer structure, is described.

EXAMPLE 1

2.2 parts of dimethyl terephthalate were added in 100 parts by weight (abbreviated as parts hereinafter) of polyethylene glycol obtained by adding ethylene oxide into ethylene glycol (weight average molecular weight: 10,000). A normal transpolyesterification was conducted to obtain a water soluble high molecular compound whose weight average molecular weight is 130,000 and water solution viscosity is 250 cps (30° C., B-type viscometer). [In the repetitive unit represented as the above general formula (1), A, X and $R_2$ are as follows.]

A : 
X : $-OCH_2CH_2O-$ $R_2$:

This water soluble high molecular compound was extruded into a sheet 100 μm thick of water soluble high molecular sheet by uniaxial extruder under the condition at a T-die temperature of 90° C.

EXAMPLE 2

The water soluble high molecular compound (weight average molecular weight: 100,000) at 10% of a water solution viscosity and 600 cps (30° C., B type viscometer) was obtained by condensation polymerizing 840 parts of polyethylene glycol (molecular weight: 8,400) with 23.2 parts of dimethyl sebacate. [In the repetitive unit represented as the above general formula (1), A, X and $R_2$ are as follows.]

A : $-\!\!\!+\!\mathrm{CH_2CH_2O}\!\!\!+\!\!\!-$
X : $-\mathrm{OCH_2CH_2O}-$
$R_2$: $-\mathrm{OC(CH_2)_8CO}-$ By employing this water soluble high molecular compound, a water soluble high molecular film of 200 μm thick was manufactured in the same manner as EXAMPLE 1.

EXAMPLE 3

180 parts of ehtylene oxide were added in 20 parts of polypropylene glycol (molecular weight: 2,000) for reaction so that polyalkylene glycol (weight average molecular weight: 20,000) was obtained. Then, 200 parts of this polyalkylene glycol and 1.94 parts of dimethyl terephthalate were condensation polymerized so that a water soluble high molecular compound at weight average molecular weight of 140,000 and 10% water solution viscosity of 260 cps (30° C., B type viscometer) was obtained. [In the repetitive unit represented as the above general formula (1), A, X and $R_2$ are as follows.]

A : $-\!\!\!+\!\mathrm{CH_2CH_2O}\!\!\!+\!\!\!-$
X : $-\mathrm{OCH_2CHCH_3O}-$ By employing this water soluble high molecular compound, a water soluble high molecular firm 200 μm thick was manufactured in the same manner as EXAMPLE 1.

EXAMPLE 4

0.84 parts of hexamethylene diisocyanate and small amount of dibutyltindilaurate are added into 100 parts of polyalkylene oxide compound (weight average molecular weight 20,000) obtained by block-addition polymerizing alkylene oxide comprising 85% ethylene oxide and 15% propylene oxide into bisphenol A, and then urethanated at 100° C., so as to prepare a water soluble high molecular compound of weight average molecular with , 2,500,000, 2% water solution viscosity 2,000 cps (30° C., B type viscometer), and melt viscosity 58° C. [In the repetitive unit represented as the above general formula (1), A, X and $R_2$ are as follows.] In addition, NCO/OH equivalent ratio is 1 in the above urethanation.

A : a unit composed of a repetition of $R_2$: $-\mathrm{NHCO(CH_2)_6NHCO}-$

By employing this water soluble high molecular compound, water soluble high molecular film 100 μm thick was manufactured in the same manner as EXAMPLE 1.

EXAMPLE 5

A mixture composed of 60 parts of polyethylene glycol (molecular weight 1,000,000) and 40 parts of polyethylene glycol disterate (molecular weight: 4,000) are prepared. A water soluble high molecular sheet 100 μm thick was manufactured from the mixture in the same method of EXAMPLE 1.

EXAMPLE 6

A water soluble high molecular compound (weight average molecular weight 20.000) was prepared by block-addition polymerizing alkylene oxide comprising 85% ethylene oxide and 15% propylene oxide into bisphenol A. This water soluble high molecular compound showed 10% water solution viscosity 9.5 cps (30° C., B type viscometer) and melt viscosity 60° C.

By employing this water soluble high molecular compound, a water soluble high molecular film 100 μm thick was manufactured at a T-die temperature of 90° C. with an uniaxial extruder.

(ii) The two-layer structure sheet as one of sheet Z, multilayer structure.

EXAMPLE 7

A solution at 30% condensation was prepared by dissolving the water soluble high molecular compound (weight average molecular weight 130,000) obtained in EXAMPLE 1 into the mixed solvent of water and methanol (mixing ratio=1.1 by weight). This solution was coated on aluminum foil surface in 100 μm thickness with a a doctor blade (doctor blade DP-150, manufactured by Tsugawaseiki-seisakusho). Aluminum foil with a water soluble high molecular film thereon was produced in this way.

EXAMPLE 8

A solution at 30% condensation was prepared by dissolving 30 parts of the water soluble high molecular compound (weight average molecular weight 100,000) obtained in EXAMPLE 2 into 70 parts of water. This solution was coated on aluminum foil surface in 100 μm thickness with a doctor blade (doctor blade DP-150, manufactured by Tsugawaseiki-seisakusho). Aluminum foil with a water soluble high molecular film thereon was produced in this way.

EXAMPLE 9

A water soluble high molecular sheet produced in the above EXAMPLE 6 was prepared. In the meantime, aluminum foil in 150 μm thickness was prepared. The aluminum foil is adhered to the above water soluble high molecular sheet by an adhesive [diabond No. 160, manufactured by Nogawa Chemical Co., Ltd.] so as to be integrated, and a sheet for drilling was obtained.

(iii) The three-layer structure in other structures of multilayer structure, sheet Z.

EXAMPLE 10

A water soluble high molecular sheet (100 μm thickness) of the above EXAMPLE 1 was prepared. Then, two pieces of aluminum foil of 150 μm thickness were prepared. An aluminum foil was adhered to each side of the water soluble high molecular sheet with an adhesive [diabond No. 160, manufactured by Nogasw Chemical Co., Ltd.] so as to be laminated so that a sheet for drilling was obtained.

EXAMPLE 11

60 parts of polyethylene glycol (molecular weight 1,000, 000) and 40 parts of polyethylene glycol disterate (molecular weight 4,000) were dissolved into water so as to prepare a solution. The solution was coated in 100 μm thick on the aluminum foil surface with a doctor blade (doctor blade device DP-150, manufactured by Tsugawaseiki-seisakusho) so as to form a water soluble high molecular layer. Furthermore, aluminum foil in 100 μm thick was adhered to the above water soluble molecular layer side with an adhesive [diabond No. 160, manufactured by Nogawa Chemical Co., Ltd.] so that a sheet for drilling was obtained.

EXAMPLE 12

A water soluble high molecular sheet (200 μm thickness) on the above EXAMPLE 2 was prepared. Then, two pieces of aluminum foil of 150 μm thickness were prepared. An aluminum foil was adhered to each side of the above water soluble high molecular sheet with a adhesive [diabond No. 160, manufactured by Nogawa Chemical Co., Ltd.] to be laminated so that a sheet for drilling was obtained.

EXAMPLE 13

A water soluble high molecular sheet (200 μm thick) of the above EXAMPLE 3 was prepared. Then, two pieces of aluminim foil of 200 μm thickness were prepared. An aluminum piece was adhered to each side of the above water soluble high molecular sheet with an adhesive [diabond No. 160, manufactured by Nogawa Chemical Co., Ltd.] so as to be laminated so that a sheet for drilling was obtained.

EXAMPLE 14

A water soluble high molecular compound (weight average molecular weight 20,000) was prepared by block-addition polymerizing alkylene oxide comprising 85% ethylene oxide and 15% propylene oxide into bisphenol A. The water solution viscosity is 9.5 cps (30° C., B type viscometer) and melt viscosity is 60° C. in this water soluble high molecular compound.

A water soluble high molecular sheet of 50 μm thickness was obtained by extruding the above water soluble high molecular compound with a uniaxial extruder at a T-die temperature of 90° C. into a sheet. Then, two pieces of aluminum foil of 150 μm thickness were prepared. An aluminum foil was adhered to each side of the above water soluble high molecular sheet with an adhesive [diabond No. 160, manufactured by Nogawa Chemical Co., Ltd.] so as to be laminated so that a sheet for drilling was obtained.

EXAMPLE 15

A water soluble high molecular sheet (100 μm thick) of the above EXAMPLE 4 was prepared. Then, two pieces of aluminum foil of 150 μm thickness were prepared. An aluminum piece was adhered to each side of the above water soluble high molecular sheet with an adhesive [diabond No. 160, manufactured by Nogawa Chemical Co., Ltd.] so as to be laminated so that a sheet for drilling was obtained.

COMPARATIVE EXAMPLE 1

A water soluble sheet (100 μm thick) formed with 50 parts of polyethylene oxide (weight average molecular weight 1,100,000) and 50 parts of polyoxyethylene sorbitan monostearate was prepared.

Then, two pieces of aluminum foil of 150 μm thickness were prepared. An aluminum piece was adhered to each side of the above water soluble high molecular sheet with an adhesive [diabond No. 160, manufactured by Nogawa Chemical Co., Ltd.] so as to be laminated so that a sheet for drilling was obtained.

COMPARATIVE EXAMPLE 2

Aluminum foil of 100 μm thickness was prepared.

COMPARATIVE EXAMPLE 3

250 parts of dipropylene glycol, 670 parts of non-ionic surfactant [trihydroxystearin and a water soluble was [polyethylene glycol (PEG-6000)]: molecular weight 8,500] and 80 parts of fatty acid ester (glycerine stearic acid ester) were mixed to form a material for a lubricant sheet. The lubricant sheet was coated on one side of a water soluble paper by a roller and dried so as to manufacture a sheet wherein a lubricant film layer in 4.5 mil was formed.

On the other hand, six-layer glass fabric base material epoxy substrate was produced as follows. First of all, R1766T [manufactured by Matsushita Electric Works Ltd., both sides with copper foil]/R1661T [manufactured by Matsushita Electrical Works Ltd., prepreg layer (0.15 mm thick)] /R1766T/R1661T/R1766T were combined in this order to be laminated, heated at 120° C. under condition of 40 kg/m$^2$ pressure for 10 to 15 minutes by a heat-pressing device, and heat formed at 170° C. for not less than 40 minutes, so that three pieces of six-layer glass fabric base material epoxy substrate were produced.

Then, three pieces of the six-layer substrate thus obtained were adhered and layered and a sheet for drilling was layered on the substrate as follows. (from the entry side) A sheet for drilling or aluminum foil/the first six-layer glass fabric base material epoxy substrate/the second six-layer glass fabric base material epoxy substrate/the third six-layer glass fabric base material epoxy substrate/paper phenol laminate.

Drilling on the above EXAMPLES and COMPARATIVE EXAMPLES was conducted under the following conditions. Then, after using 4,000 hits, drilling was conducted. Each cut surface was evaluated by visual observation. The results are shown in Table 1 below. In addition, evaluation in Table 1 is indicated by the following four steps.

⊚: No debris could be seen.

○: Substantially no debris could be seen.

Δ: A small amount of debris could be seen.

×: A lot of debris could be seen. [Drilling condition]

① Drill bit diameter: 0.30 mm

② Drill revolution speed: 80,000 rpm

③ Feed speed: 1.6 mm/min

TABLE 1

| | EVALUATION AFTER DRILLING | | |
|---|---|---|---|
| | 1st substrate | 2nd substrate | 3rd substrate |
| EXAMPLE | | | |
| 1 | ⊚ | ⊚ | ⊚ |
| 2 | ⊚ | ⊚ | ⊚ |
| 3 | ⊚ | ⊚ | ⊚ |
| 4 | ⊚ | ⊚ | ⊚ |
| 5 | ⊚ | ⊚ | ⊚ |
| 6 | ⊚ | ⊚ | ⊚ |
| 7 | ⊚ | ⊚ | ⊚ |
| 8 | ⊚ | ⊚ | ⊚ |
| 9 | ⊚ | ⊚ | ⊚ |
| 10 | ⊚ | ⊚ | ⊚ |
| 11 | ⊚ | ⊚ | ⊚ |

TABLE 1-continued

| | EVALUATION AFTER DRILLING | | |
|---|---|---|---|
| | 1st substrate | 2nd substrate | 3rd substrate |
| 12 | ◎ | ◎ | ◎ |
| 13 | ◎ | ◎ | ◎ |
| 14 | ◎ | ◎ | ◎ |
| COMPARATIVE EXAMPLE | | | |
| 1 | X | X | X |
| 2 | Δ | Δ | X |
| 3 | X | X | X |

As is apparent from the results from the above Table 1, debris was not identified in three substrates of all EXAMPLES, which shows that debris was acquired by the water soluble high molecular compound melted with the heat of drilling. On the other hand, a lot of debris was identified in three substrates and also cut surfaces were rough in COMPARATIVE EXAMPLE 1. Furthermore, debris was identified and debris stuck to the thru-holes and the neighboring portion in COMPARATIVE EXAMPLE 2.

Then, surface roughness of the inner copper layer in the multilayer lamination substrate, which was drilled, was evaluated by visual observation. The results will be shown in Table 2.

In addition, evaluation in Table 2 is indicated by the following four steps. That is, first of all, to expose the inner copper surface of each multilayer lamination substrate for evaluation, upper layers such as epoxy resin layer and the like were ground by a grinder until the copper surface was visible. When the copper surface was seen, an enlarged photograph of each portion was taken by microscope. From the photographs, centering around thru-holes, surface roughness was valued by visual observation. In addition, each inner copper of the third substrate of six-layer substrate from the entry side was exposed so that microphotographs were taken for evaluation.

◎: No haloing could be seen.
○: Substantially no haloing could be seen.
Δ: A small amount of haloing could be seen.
X: Haloing could be seen.

TABLE 2

| | EVALUATION OF HALOING 3rd inner copper of 3rd lamination substrate |
|---|---|
| EXAMPLE | |
| 1 | ◎ |
| 2 | ◎ |
| 3 | ◎ |
| 4 | ◎ |
| 5 | ◎ |
| 6 | ◎ |
| 7 | ◎ |
| 8 | ◎ |
| 9 | ◎ |
| 10 | ◎ |
| 11 | ◎ |
| 12 | ◎ |
| 13 | ◎ |
| 14 | ◎ |
| COMPARATIVE EXAMPLE | |
| 1 | X |

TABLE 2-continued

| | EVALUATION OF HALOING 3rd inner copper of 3rd lamination substrate |
|---|---|
| 2 | X |
| 3 | X |

From the results of Table 2, it is found out that no haloing could be seen and occurrence of haloing was prevented in EXAMPLES 1 to 14. On the other hand, haloing was obviously identified in COMPARATIVE EXAMPLES.

Then, the accuracy of positioning thru-holes was evaluated as follows. That is, positioning in each substrate was decided before drilling with a driller and drilling was conducted on three-layered substrates. After that, the discrepancy between center positions of the first substrate and the third substrate was measured by a calipers. The results are shown in Table 3. In addition, each evaluation was indicated by the following four steps.

◎: No discrepancy could be seen.
○: Substantially discrepancy could not be seen.
Δ: A little discrepancy could be seen. (about 50 to 75 μm)
X: Discrepancy could be seen. (not less than 100 μm)

TABLE 3

| | ACCURACY OF POSITIONING THRU-HOLES |
|---|---|
| EXAMPLE | |
| 1 | ◎ |
| 2 | ◎ |
| 3 | ◎ |
| 4 | ◎ |
| 5 | ◎ |
| 6 | ◎ |
| 7 | ◎ |
| 8 | ◎ |
| 9 | ◎ |
| 10 | ◎ |
| 11 | ◎ |
| 12 | ◎ |
| 13 | ◎ |
| 14 | ◎ |
| COMPARATIVE EXAMPLE | |
| 1 | X |
| 2 | X |
| 3 | X |

From the results of Table 3, no discrepancy between the first substrate and the third substrate could be seen in all the EXAMPLES. On the other hand, there was a discrepancy of 120 μm between the first one and the third one.

What is claimed is:

1. A method for forming thru-holes in a lamination substrate made of insulating material and metal foil comprising placing a sheet on the entry surface of the lamination substrate and forming thru-holes on the lamination substrate through the sheet, said sheet comprising a multilayer sheet made by piling up water soluble high molecular layers on sheet material wherein one component at least selected from the group of component (a) and component (a) as below is a principal component, wherein (a) is a water soluble high molecular compound comprising an organic compound residue having two active hydrogen groups, wherein the above ($CH_2CH_2O$) is contained at not less than 70% by weight, and

(b) is a water soluble high molecular compound comprising a repetitive unit represented as the following general formula (1):

wherein, in the above formula (1), A is a unit composed of a repetition of provided that the above exists at not less than 70% by weight in A, a repetitive number of is a positive number, and a repetitive number of is zero or a positive number; $R_1$ is a hydro carbon group, X is an organic compound residue with two active hydrogen groups, and $R_2$ is a polycarboxylate compound residue or a diisocyanate compound residue.

2. A method for forming thru-holes in a lamination substrate according to claim 1, wherein said multilayer sheet is a sheet comprising said sheet material and said water soluble high molecular layer formed on at least one side thereon.

3. A method for forming thru-holes in a lamination substrate according to claim 1, wherein said multilayer sheet is a three-layer structure comprising said water soluble high molecular layer and said sheet material, which sandwiches said soluble high molecular layer.

4. A method for forming thru-holes in a lamination substrate according to any one of claims 1–3, wherein said sheet material is metallic foil.

5. A method for forming thru-holes in a lamination substrate according to claim 4, wherein the weight average molecular weight of said water soluble high molecular compound of said component (a) is not less than 1,000.

6. A method for forming thru-holes in a lamination substrate according to claim 5, wherein the weight average molecular weight of said water soluble high molecular compound of said component (b) is not less than 10,000.

7. A method for forming thru-holes in a lamination substrate according to any one of claims 1–3, wherein said water soluble high molecular compound of said component (a) is a polyalkylene oxide compound obtained by addition polymerizing alkylene oxide mainly composed of ethylene oxide into an organic compound having two active hydrogen groups.

8. A method for forming thru-hoes in a lamination substrate according to any one of claims 1–3, wherein said water soluble high molecular compound of said component (b) is formed by reacting the following (A) and (B);

(A) a polyalkylene oxide compound obtained by addition polymerizing alkylene oxide mainly composed of ethylene oxide into an organic compound having two active hydrogen groups, and

(B) at lest one selected from the group of polycarboxylate compounds and diisocyanate compounds.

9. A single-layer sheet for forming thru-holes consisting of a water soluble high molecular compound whose principal component is at lest one selected from the group consisting of the following component (a) and component (b);

(a) a water soluble high molecular compound comprising an organic compound residue having two active hydrogen groups, wherein the above is contained at not less than 70% by weight;

(b) a water soluble high molecular compound comprising a repetitive unit represented as the following general formula (1):

(1)

wherein, in the above formula (1), A is a unit composed of a repetition of provided that the above exists at not less than 70% by weight in A, a repetitive number of is a positive number, and a repetitive number of is zero or a positive number; $R_1$ is a hydro carbon group, X is an organic compound residue with two active hydrogen groups, and $R_2$ is a polycarboxylate compound residue or a diisocyanate compound residue.

10. A multilayer sheet for forming thru-holes obtained by layering a water soluble high molecular compound layer whose principal component is at least one selected from the group consisting of the following component (a) and component (b):

(a) a water soluble high molecular compound comprising an organic compound residue having two active hydrogen groups, wherein the above is contained at not less than 70% by weight, and (b) a water soluble high molecular compound comprising a repetitive unit represented as the following general formula (1):

$$\text{\textendash}(AXAR_2)\text{\textendash} \tag{1}$$

wherein in the above formula (1), A is a unit composed of a repetition of provided that the above exists at not less than 70% by weight in A, a repetitive number of is a positive number, and a repetitive number of is zero or a positive number; $R_1$ is a hydrocarbon group, X is an organic compound residue with two active hydrogen groups, and $R_2$ is a polycarboxylate compound residue or a diisocyanate compound residue.

11. A sheet for forming thru-holes according to claim 10, wherein said water soluble high molecular layer is formed on at least one side of said sheet material.

12. A sheet for forming thru-holes according to claim 10, wherein said sheet is a three-layer structure comprising said water soluble high molecular layer and two pieces of sheet material, sandwiching said water soluble high molecular layer.

13. A sheet for forming thru-holes according to any one of claims 10–12, wherein said sheet material is metallic foil.

14. A sheet for forming thru-holes according to claim 13, wherein the weight average molecular weight of said water soluble high molecular compound of said component (a) is not less than 1,000.

15. A sheet for forming thru-holes according to claim 13, wherein the weight average molecular weight of said component (b) is not less than 10,000.

16. A sheet for forming thru-holes according to claim 13, wherein said water soluble high molecular compound of said component (a) is formed by addition polymerizing alkylene oxide mainly made of ethylene oxide into an organic compound having two active hydrogen groups.

17. A sheet for forming thru-holes according to claim 13, wherein said water soluble high molecular compound of said component (b) is formed by reacting the following (A) and (B):

(A) a polyalkylene oxide compound prepared by addition polymerizing alkylene oxide, whose principle component is ethylene oxide, with an organic compound having two active hydrogen groups, and

(B) at least one selected from the group of polycarboxylate compounds and diisocyanate compounds.

18. A method for forming thru-holes in a lamination substrate made of insulating material and metal foil comprising placing a sheet on the entry surface of the lamination substrate and forming thru-holes on the lamination substrate through the sheet, said sheet comprising a high molecular sheet comprising a water soluble high molecular compound wherein one component at least selected from the group of component (a) and component (b) below is a principal component, wherein:

(a) is a water soluble high molecular compound comprising an organic compound residue having two active hydrogen groups, wherein the above is contained at not less than 70% by weight, and

(b) is a water soluble high molecular compound comprising a repetitive unit represented as the following general formuala (1):

$$\text{\textendash}(AXAR_2)\text{\textendash} \tag{1}$$

wherein, in the above formula (1), A is a unit composed of a repetition of provided that the above exists at not less than 70% by weight in A, a repetitive number of is a positive number, and a repetitive number of is zero or a positive number; $R_1$ is a hydro carbon group, X is an organic compound residue with two active hydrogen groups, and $R_2$ is a polycarboxylate compound residue or a diisocyanate compound residue.

19. A method for forming thru-holes in a lamination substrate according to claim 18, wherein said sheet material is metallic foil.

20. A method for forming thru-holes in a lamination substrate according to claim 19, wherein the weight average molecular weight of said water soluble high molecular compound of said component (a) is not less than 1,000.

21. A method for forming thru-holes in a lamination substrate according to claim 20, wherein the weight average molecular weight of said water soluble high molecular compound of said component (b) is not less than 1,000.

22. A method for forming thru-holes in a lamination substrate according to claim 18, wherein said water soluble high molecular compound of said component (a) is a polyalkylene oxide compound obtained by addition polymerizing alkylene oxide mainly composed of ethylene oxide into an organic compound having two active hydrogen groups.

23. A method for forming thru-holes in a lamination substrate according to claim 18, wherein said water soluble high molecular compound of said component (b) is formed by reacting the following (A) and (B);

(A) a polyalkylene oxide compound obtained by addition polymerizing alkylene oxide mainly composed of ethylene oxide into an organic compound having two active hydrogen groups, and (B) at least one selected from the group of polycarboxylate compounds and diisocyanate compounds.

* * * * *

UNITED STATES PATENT AND TRADEMARK OFFICE
CERTIFICATE OF CORRECTION

PATENT NO. : 5,507,603
DATED : April 16, 1996
INVENTOR(S) : Takuji NAKANO et al.

It is certified that error appears in the above-indentified patent and that said Letters Patent is hereby corrected as shown below:

Column 16, line 63, change "(a)" to --(b)-- (2nd occurrence)

Column 18, line 1, delete "hoes" and insert --holes--.

Signed and Sealed this

Seventeenth Day of September, 1996

Attest:

BRUCE LEHMAN

Attesting Officer     Commissioner of Patents and Trademarks